Figure 1:
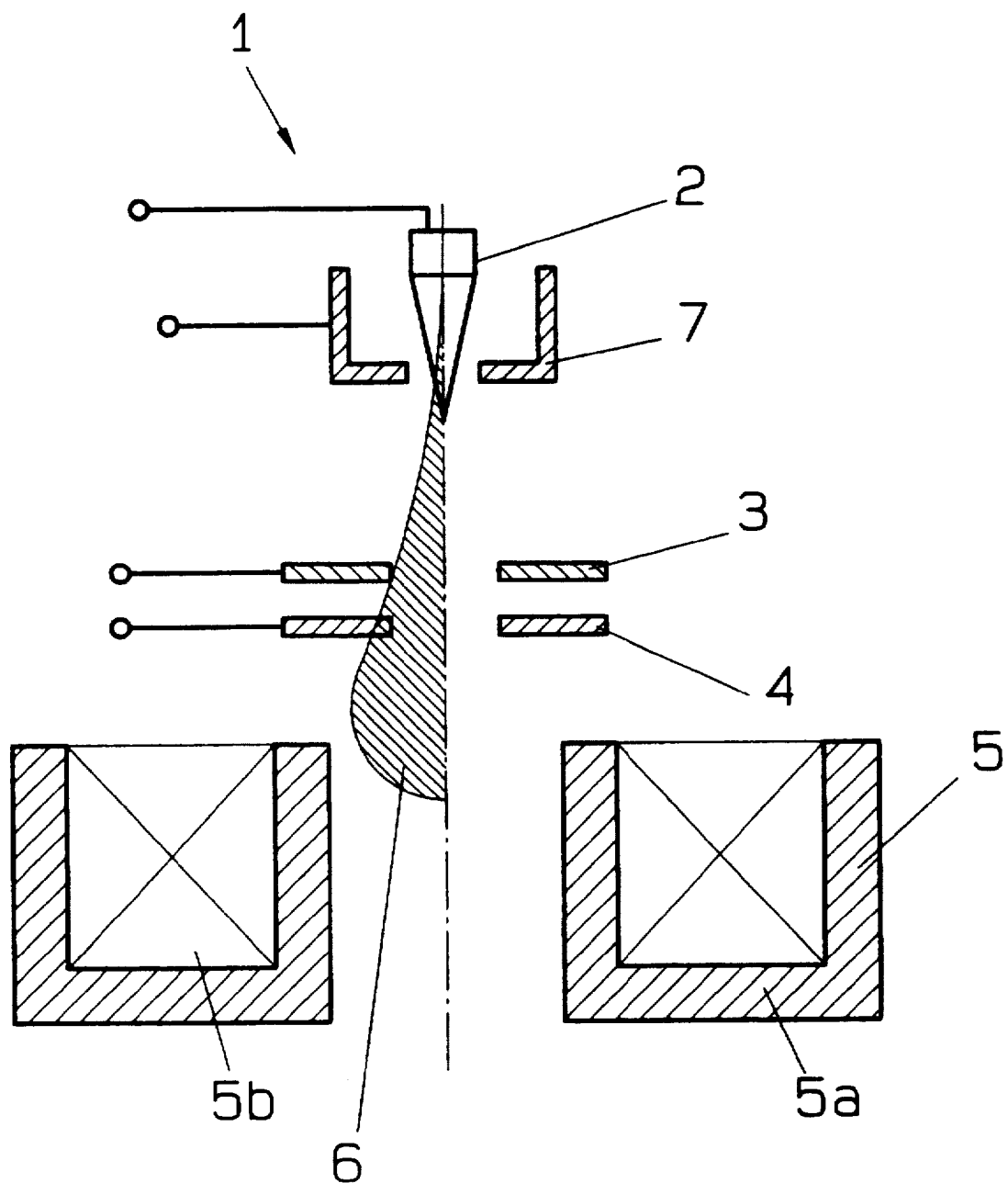

United States Patent [19]
Frosien et al.

[11] Patent Number: 5,895,919
[45] Date of Patent: Apr. 20, 1999

[54] GUN LENS FOR GENERATING A PARTICLE BEAM

[75] Inventors: Jürgen Frosien, Riemerling; Stefan Lanio, Erding; Gerald Schönecker, Munich, all of Germany

[73] Assignee: Advantest Corporation, Gyoda, Japan

[21] Appl. No.: 08/991,681

[22] Filed: Dec. 16, 1997

[30] Foreign Application Priority Data

Dec. 24, 1996 [EP] European Pat. Off. .............. 96120867

[51] Int. Cl.$^6$ .................. G21K 1/08; H01J 3/02
[52] U.S. Cl. ............... 250/396 R; 250/396 ML; 313/361.1; 313/363.1
[58] Field of Search ............. 250/396 R, 396 ML; 313/361.1, 363.1

[56] References Cited

U.S. PATENT DOCUMENTS

| | | | |
|---|---|---|---|
| 4,825,080 | 4/1989 | Troyon | 250/396 R |
| 5,041,732 | 8/1991 | Saito et al. | 250/396 ML |
| 5,196,707 | 3/1993 | Gesley | 250/398 |
| 5,371,371 | 12/1994 | Yamazaki et al. | 250/396 R |

OTHER PUBLICATIONS

A. Delong, J. Chmelik, V. Kolarik, J. Komurka, and J. Ocadlik, A New Design of Field Emission Electron Gun with a Magnetic Lens, pp. 103–108 of Optik, (1989) Febr. No. 3, Stuttgart, DE.

*Primary Examiner*—Edward P. Westin
*Assistant Examiner*—Nikita Wells
*Attorney, Agent, or Firm*—Reising, Ethington, Barnes, Kisselle, Learman & McCulloch, P.C.

[57] ABSTRACT

The invention relates to a gun lens for generating a particle beam with a cathode, an extraction electrode, an anode and a condenser lens, wherein a deceleration field is generated between the extraction electrode and the anode and the condenser lens produces a magnetic field which is superimposed on both the cathode, the extraction electrode and the anode.

15 Claims, 3 Drawing Sheets

GUN LENS FOR GENERATING A PARTICLE BEAM

The invention relates to a gun lens for generating a particle beam according to the preamble to claim 1. The gun lens has a cathode, an extraction electrode, an anode and a condenser lens. The invention also relates to a particle beam device with such a gun lens.

Gun lenses with the most varied designs are known in the art. A. Delong, J. Chmelik, V. Kolarik, J. Komurka, J. Ocadlik, "A new design of field emission electron gun with a magnetic lens", Optik No. 3, 1989, pages 104 to 108, shows the field emission sources used in the art with a partially superimposed magnetic field.

Such field emission sources are used for example in particle beam devices, particularly electron beam microscopes. In the past it was assumed that the smallest spherical and chromatic aberrations were obtained if the electrons were first of all accelerated and only decelerated to the final energy shortly before reaching the specimen. Such devices have proved worthwhile in practice. Tests were also carried out in which the particles already have their final energy in the gun. However, with these guns relatively high aberration coefficients have to be accepted, and in many applications these can no longer be tolerated.

The object of the invention, therefore, is to provide a gun lens according to the preamble to claim 1 and a particle beam device according to the preamble to claim 14 for generating a particle beam with low aberration coefficients and high spatial resolution.

This object is achieved according to the invention by the combination of the characterising features of claims 1 and 14 respectively, in that a deceleration field is generated between the extraction electrode and the anode and the condenser lens causes a magnetic field which is superimposed on both the cathode, the extraction electrode and the anode.

The superimposed magnetic field forces the generated particle beam on trajectories around the optical axis, so that in particular spherical and chromatic aberrations are reduced.

Further embodiments of the invention are the subject matter of the subordinate claims.

In a preferred embodiment the anode is at ground potential. This substantially simplifies the construction of a particle beam device, since all subsequent arrangements can also be at ground potential.

Figure 2:
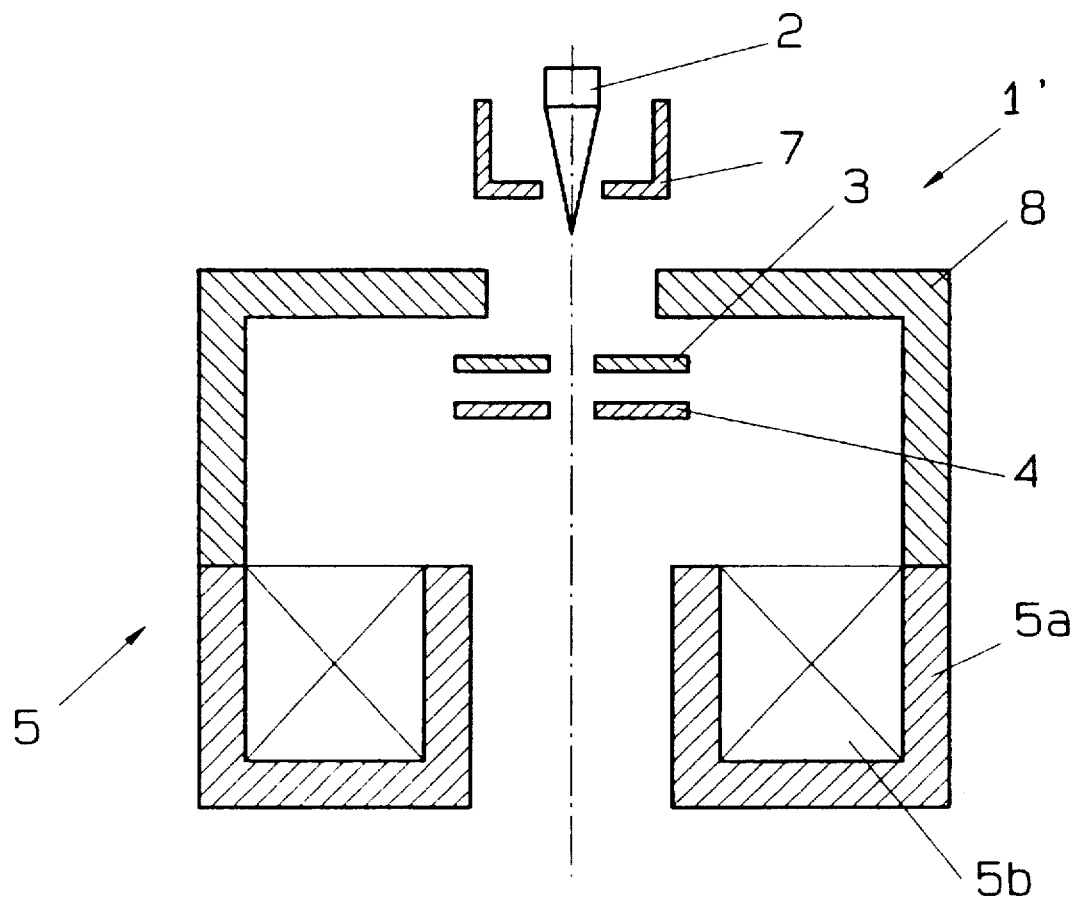
Figure 3:
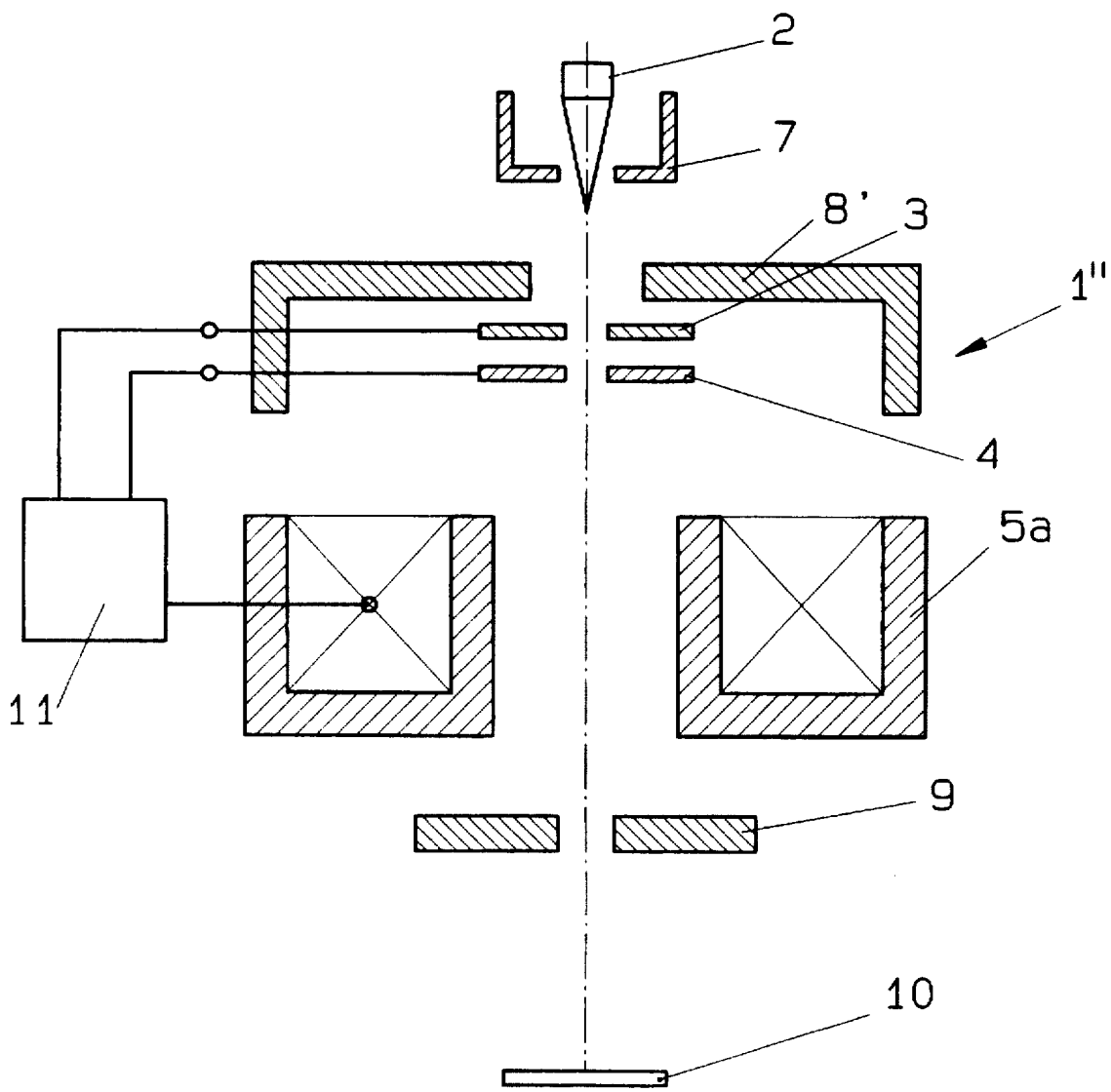

Further advantages and embodiments of the invention will be explained in greater detail with reference to the description of some embodiments and the drawings, in which:

FIG. 1 shows a schematic sectional representation of a gun lens according to a first embodiment, FIG. 2 shows a schematic sectional representation of a gun lens according to a second embodiment, and FIG. 3 shows a schematic sectional representation of a particle beam device with a gun lens according to a third embodiment.

A gun lens 1 for generating a particle beam is shown in FIG. 1. It essentially comprises a cathode 2, an extraction electrode 3, an anode 4 and a condenser lens 5.

The cathode 2 is constructed as a photocathode or a field emission cathode as required. It is supplied with a potential $U_K$. Furthermore, the extraction electrode 3 and the anode 4 are at a potential $U_{Ex}$ or $U_{An}$ respectively.

The potential distribution between the cathode, extraction electrode and anode is chosen so that a deceleration field is generated between the extraction electrode 3 and the anode 4. In this deceleration field the particles emitted on the cathode 2 are preferably decelerated to a final energy of less than 3 keV.

The condenser lens 5 generates a magnetic field which is superimposed on both the cathode 2, the extraction electrode 3 and the anode 4. An axial magnetic field distribution is indicated by way of example in FIG. 1 and is designated by the reference numeral 6.

The condenser lens 5 conventionally consists of an iron circuit 5a and a coil 5b. In the illustrated embodiment the condenser lens 5 is constructed as a single-pole lens.

Especially when the cathode 2 is constructed as a thermal field emission cathode it is particularly advantageous to superimpose this cathode with a suppressor electrode 7. This suppressor electrode 7 suppresses the particles which are not emerging directly from the cathode tip. Particles which originate from areas remote from the tip expand the virtual source size and accordingly reduce the brightness.

In FIG. 2 a second embodiment of a gun lens 1' is illustrated, which differs from the embodiment according to FIG. 1 only by an element made from magnetic material 8 for influencing the magnetic field generated by the condenser lens in the region of the cathode. This element 8 made from magnetic material is advantageously disposed between the cathode 2 and the extraction electrode 3.

In the illustrated embodiment according to FIG. 2 the element 8 made from magnetic material is coupled to the iron circuit 5a of the condenser lens 5. With this magnetic element 8 the magnetic field of the condenser lens 5 can be precisely influenced in the region of the cathode tip.

Within the scope of the invention the magnetic element 8 and the extraction electrode 3 can be constructed as one component which takes on the function of the extraction electrode and also of the magnetic element. However, it would also be conceivable for the element 8 to contain the extraction electrode 3 as a diaphragm insert, in which case both electrodes could be at the same or different potential.

A particle beam device with a gun lens 1" and a beam blanking system 9 is illustrated in FIG. 3.

The gun lens 1" differs from the gun lens according to FIG. 2 again only by an element 8' made from magnetic material which influences the magnetic field of the condenser lens 5. The element 8' in this case is not coupled to the iron circuit 5a of the condenser lens 5 but, rather, forms an air gap with the iron circuit 5a.

As the individual electrodes in the gun lens are charged so that the emitted particles are already decelerated to their final energy in the gun and moreover the anode is at ground potential, all subsequent components of the particle beam device can also be grounded. Since the particle beam is usually guided in a vacuum, this makes it possible to dispense with the costly decoupling of the high voltage from subsequent components.

Apart from other diaphragms and lenses the particle beam device also has in particular a beam blanking system 9 with which the particle beam striking a specimen 10 can be blanked if required. For a high spatial resolution in the region of the specimen it is particularly advantageous if the gun lens produces a beam crossover in the region of the beam blanking system 9.

Thus the gun lens also acts as a focusing element which images the virtual beam crossover of the gun into the optical system. The focal length with a given final energy of the particle beam is determined by the potential of the extraction electrode 3 and the excitation of the condenser lens 5. In order to achieve constant lens properties, i.e. a constant focal length, if the potential $U_{Ex}$ is altered the excitation of the condenser lens 5 must be adjusted correspondingly. The control of the potentials as well as the excitation of the condenser lens is effected by way of a control unit 11 which operates according to a predetermined program.

At a final energy of the particles of in the region of 200 eV to 5 keV the voltage of the extraction electrode 3 is in the range between 3 kV and 7 kV, the voltage depending essentially upon the geometry of the source, the distance of the extraction electrode 3 from the emitter and the emission current. A typical voltage of the suppressor electrode 7 is between −100 Volt and −1 kV.

The gun lens 1, 1', 1" according to the invention is distinguished by high brightness, low aberration coefficients and a high spatial resolution.

We claim:

1. Gun lens (1, 1', 1") for generating a particle beam with
   a cathode (2),
   an extraction electrode (3),
   an anode (4)
   and a condenser lens (5),
   characterised in that a deceleration field is generated between the extraction electrode (3) and the anode (4) and the condenser lens produces a magnetic field (6) which is superimposed on both the cathode (2), the extraction electrode (3) and the anode (4).

2. Gun lens as claimed in claim 1, characterised in that the anode (4) is at ground potential.

3. Gun lens as claimed in claim 1, characterised in that the particles emitted on the cathode (2) are decelerated to a final energy of less than 3 keV in the deceleration field between the extraction electrode (3) and the anode (4).

4. Gun lens as claimed in claim 1, characterised in that the condenser lens (5) is constructed as a single-pole lens.

5. Gun lens as claimed in in claim 1, characterised in that the cathode (2) is formed by a field emission cathode.

6. Gun lens as claimed in claim 1, characterised in that the cathode (2) is formed by a thermal field emission cathode which is superimposed with a suppressor electrode (7).

7. Gun lens as claimed in claim 1, characterised in that the cathode (2) is formed by a photocathode.

8. Gun lens as claimed in claim 1, characterised in that an element (8, 8') made from magnetic material is provided in order to influence the magnetic field produced by the condenser lens (5) in the region of the cathode.

9. Gun lens as claimed in claim 8, characterised in that the condenser lens (5) has an iron circuit (5a) which is coupled to the element (8) made from magnetic material.

10. Gun lens as claimed in claim 8, characterised in that the condenser lens (5) has an iron circuit (5a) which forms an air gap with the element (8) made from magnetic material.

11. Gun lens as claimed in claim 8, characterised in that the element (8, 8') made from magnetic material is disposed between the cathode (2) and the extraction electrode (3).

12. Gun lens as claimed in claim 8, characterised in that the element (8) made from magnetic material is formed by the extraction electrode (3).

13. Gun lens as claimed in claim 8, characterised in that the element (8) made from magnetic material is disposed in the region of the extraction electrode (3).

14. Particle beam device with
   a) a gun lens (1, 1', 1") for generating a particle beam with
      a1) a cathode (2),
      a2) an extraction electrode (3),
      a3) an anode (4)
      a4) and a condenser lens (5),
   b) a beam blanking system (9) for blanking the particle beam,
characterised in that a deceleration field is generated between the extraction electrode (3) and the anode (4) and the condenser lens (5) produces a magnetic field which is superimposed on both the cathode (2), the extraction electrode (3) and the anode (4).

15. Particle beam device as claimed in claim 14, characterised in that the gun lens (1, 1', 1") produces a beam crossover in the beam blanking system (9).

* * * * *